United States Patent [19]

Suzuki et al.

[11] Patent Number: 4,872,964
[45] Date of Patent: Oct. 10, 1989

[54] PLANAR MAGNETRON SPUTTERING APPARATUS AND ITS MAGNETIC SOURCE

[75] Inventors: Masafumi Suzuki, Kawasaki; Hidenobu Shirai, Seto, both of Japan

[73] Assignee: Fujitsu Limited, Kawasaki, Japan

[21] Appl. No.: 237,689

[22] Filed: Aug. 26, 1988

Related U.S. Application Data

[63] Continuation of Ser. No. 85,295, Aug. 13, 1987, abandoned, which is a continuation of Ser. No. 890,238, Jul. 29, 1986, abandoned.

[30] Foreign Application Priority Data

Aug. 2, 1985 [JP] Japan ................... 60-171327

[51] Int. Cl.$^4$ .............................................. C25C 14/34
[52] U.S. Cl. ................................ 204/298; 204/192.12
[58] Field of Search ....... 204/192.12, 192.1, 298 MM, 204/298 C, 298 ME, 298 PM, 298 CM, 298 EE

[56] References Cited

U.S. PATENT DOCUMENTS

| 3,878,085 | 4/1975 | Corbani | 204/298 |
| 4,022,947 | 5/1977 | Grubb et al. | 204/298 X |
| 4,162,954 | 7/1979 | Morrison, Jr. | 204/298 |
| 4,361,472 | 11/1982 | Morrison, Jr. | 204/298 X |
| 4,444,643 | 4/1984 | Garrett | 204/298 |
| 4,466,877 | 8/1984 | McKelvey | 204/298 |
| 4,498,969 | 2/1985 | Ramachandran | 204/298 |
| 4,552,639 | 11/1985 | Garrett | 204/298 |
| 4,557,819 | 12/1985 | Meacham et al. | 204/298 |

FOREIGN PATENT DOCUMENTS

| 0213922A2 | 8/1986 | European Pat. Off. . | |
| 2707144 | 2/1977 | Fed. Rep. of Germany | 204/298 |
| 58-141384 | 8/1983 | Japan . | |
| 59-18638 | 1/1984 | Japan . | |
| 59-173265 | 10/1984 | Japan . | |
| 59-215484 | 12/1984 | Japan . | |
| 2125440A | 7/1983 | United Kingdom . | |
| 2126257A | 8/1983 | United Kingdom . | |

Primary Examiner—Nam X. Nguyen
Attorney, Agent, or Firm—Armstrong, Nikaido, Marmelstein, Kubovcik & Murray

[57] ABSTRACT

A planer magnetron sputtering apparatus having a magnetic source which is rotated eccentrically around the axis of the target and has a particular arrangement of a plurality of permanent magnets to form the magnetic field. Using this particular arrangement of permanent magnets, the target surface is exposed to the plasma for the same period of time, and this increases the uniformity of the target erosion and deposits the sputtered material uniformly on the substrate, as a result, an increase of the lifetime of the target can be expected.

9 Claims, 7 Drawing Sheets

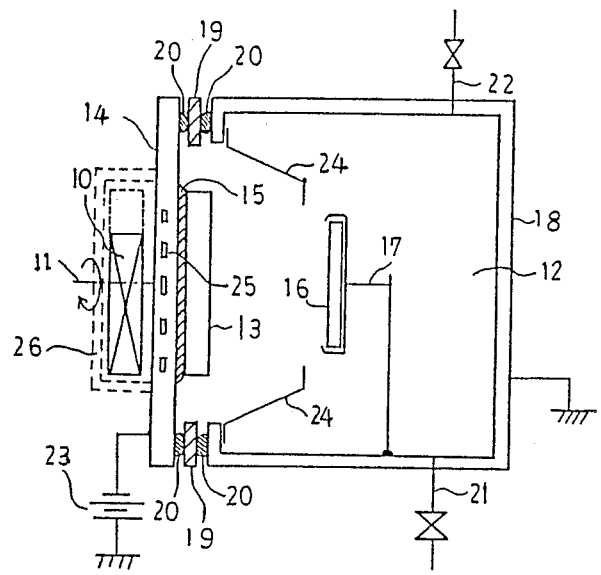
FIG. 3
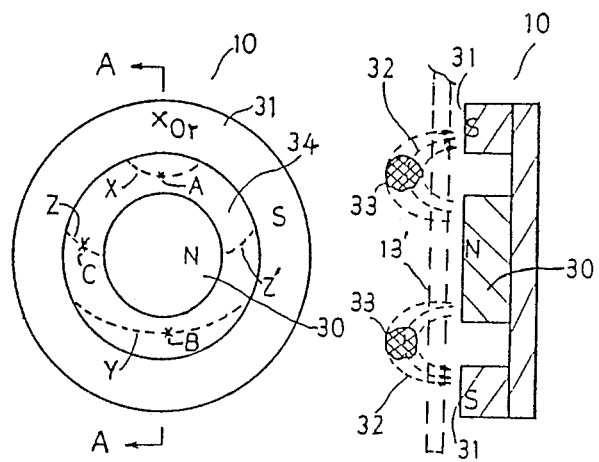
FIG. 4(a)
PRIOR ART
FIG. 4(b)
PRIOR ART (b)

(a)

PLANAR MAGNETRON SPUTTERING APPARATUS AND ITS MAGNETIC SOURCE

This application is a continuation of application Ser. No. 085,295 filed Aug. 13, 1987 which is a continuation of application Ser. No. 890,238 filed July 29, 1986 all abandoned.

BACKGROUND OF THE INVENTION

1. Field of the Invention

This invention relates to a planar magnetron sputtering apparatus. More particularly, this invention relates to the improvements in a structure to generate a magnetic field over a target surface. The invention is intended to make an erosion of the target surface uniform and also to deposit the sputtering material uniformly on a substrate.

2. Description of the Prior Art

A sputtering process to coat semiconductor surface with a conductive or insulating material is well known.

When an electric field of direct or alternating voltage is applied in proximity to a target plate in an inert gas of a reduced pressure, it generates gas ions. Gas ions cause particles of target material to be dislodged and to be deposited on a substrate. This method utilizing only an electric field shows relatively uniform deposition on the substrate, however it has a low rate of deposition. Therefore it has not been suitable to form a thick layer on the substrate.

Recently to improve the deposition rate, a magnetron sputtering method has been introduced, wherein an arched magnetic field is superimposed on the electric field. The magnetic flux used herein exits from and returns to the surface of the sputtering target. The conventional magnetic source of the prior art, provided behind the target, comprises inner and outer magnets and a connecting yoke for the opposite sides of both magnets. The magnetic flux, exiting from one pole and returning to the opposite pole, crosses the target twice, thus forms an arch of magnetic field.

Typical magnet arrangements are shown in FIG. 1 and FIG. 2. FIG. 1 shows a cross sectional view of the magnet arrangement 5 and the target 4 provided thereabove, and other parts are omitted for simplicity. This type has a coaxial arrangement of the inner and outer magnet 1 and 2 respectively and a disk-shaped yoke 3. FIG. 2 has a perspective view of another type of magnet, wherein the target is removed. The outer magnet 2 is a box-like one, and the inner magnet 1 is a straight bar type and arranged in the center as shown in FIG. 2.

An electric field is applied normal to the surface of the target, therefore the electrons generated move under the influences of such crossed electric and magnetic fields, ionizing gas molecules and thereby producing a plasma. The motion of electrons is limited in a doughnut shaped region over the target under the arch of magnetic field, and this region may be compared with a tunnel of the arches of magnetic field. By such motion of electrons, a chance to ionize gas molecule is greatly enhanced, as a result, high density plasma is generated. Gas ions are attracted by the electric field to the target surface and erode the target material, thus a correspondingly high rate of deposition is obtained.

The above magnet structures are disclosed in U.S. Pat. No. 3,878,085, issued to J. F. Corbani on Apr. 15, 1975.

One drawback of the above planar magnetic source is a fact that the erosion takes place in a relatively narrow ring-shaped region corresponding to the tunnel width of the magnetic field. The path of an electron leaving the target is approximately perpendicular to the surface thereof, then the parallel component of the arched magnetic field with respect to the target surface, deflects the electron movement along the path of the magnetic tunnel. In the region just above both poles of magnetic source, the magnetic field is almost perpendicular to the target surface, resulting in very small parallel component, therefore the electrons can easily escape from the magnetic tunnel, as a result, the ionization region is limited to a narrow path along the tunnel. This results in low sputtering rates and poor uniformity of deposition on the substrate.

Because the erosion pattern of the target takes a form of an annular valley, the target has to be replaced even when the other area is remaining almost unchanged with very slight sputtering. A life of the target, which generally is expensive, is limited by the progress of erosion in the annular valley area, and the efforts have been made to increase the area of uniform erosion on the target.

Many types of the magnetic source have been proposed to improve an erosion uniformity of the target. Some of them are referred to as follows.

In U.S. Pat. No. 3,956,093, issued to P. S. McLeod on May 11, 1976, a magnetic source having an additional source of variable magnetic field is described.

In U.S. Pat. No. 4,162,954, issued to C. F. Morrison on July 31. 1979, a magnetic source of stacked or rolled magnetic tape to form a solid and flat coil parallel to the target is illustrated.

In U.S. Pat. No. 4,282,083, issued to G. Kertesz, and G. Vago on Aug. 4, 1981, improvements for a Penning sputter source, which results in an increase of the active zone of the target and uniform utilization thereof, are described.

In provisional publication of Japanese Patent, TOKUKAISHYO 58-87270, issued on May 25, 1983, by K. Abe, a magnetic source having a plurality of electro-magnets coaxially arranged is described.

All these patents relates to the structure of a fixed magnetic source with respect to the target. Therefore they can not completely solve the problem, and there still remains an uneven erosion of the target forming a valley or a groove on the target surface.

In order to solve the problem more effectively, a method to move the magnetic source in parallel to the target surface is proposed. A structure, wherein a circular magnet assembly being rotated in parallel with the target and eccentrically around the shaft located at the center of the target, is representative. An example of such a structure is mentioned in U.S. Pat. No. 4,444,643, issued to C. B. Garrett on Apr. 24, 1984.

FIG. 3 shows a schematic cross sectional view of a planar magnetron sputtering apparatus. A magnetic source 10 is provided outside a vacuum chamber 12 and can be rotated eccentrically around a shaft 11 (rotation mechanism is not shown). A target plate 13 of aluminum or aluminum alloy material, for example, is fixed on a backing plate 14 by soldering material 15. A substrate 16 is supported by a holding means 17 and held facing target 13 in parallel therewith. A vacuum chamber consists of chamber wall 18, backing plate 14, insulating plate 19, and two vacuum packing rings 20. During operation of the apparatus, the target is usually heated to a high temperature by ion bombardments, therefore the backing plate 14 is often cooled by the circulating water through the holes 25, or the magnetic source 10 is encased in a jacket 26 (shown by the dashed lines in the figure), which is fixed to backing plate 14 and is cooled by the circulating water.

The chamber is exhausted from exhaust pipe 21, and an inert gas such as argon is introduced from inlet pipe 22. The pressure of the chamber is maintained at $10^{-2}$ to $10^{-3}$ Torr during operation. The negative terminal of a power supply 23 is connected to the backing plate 14, which holds the target 13. An electric field is formed between an anode 24 and the target 13.

In FIGS. 4(a) and 4(b), a plan view of the magnetic source 10, and a cross sectional view along a line A-A are shown. The magnetic source 10 has a coaxial structure having an N-type center pole 30 and an S-type annular pole 31. Each magnet may be consisted of single magnet or a plurality of small magnets.

The magnetic source 10 is rotated around the shaft 11. In FIG. 4(a), the axis of rotation is shown as Or. In FIG. 4(b), target position is partly shown by dashed line 13', and magnetic field is shown by dashed curves 32 with an arrow, which show arched curves above the target surface.

The cross hatched area 33 shows a plasma abundant region, and this annular region, which is correspondingly shown as a ring section 34 in FIG. 4 (a), sweeps the surface of the target having Or as a revolving center. When annular ring 34 rotates around Or, eroding the target surface, a portion of the ring region in a vicinity of point B sweeps much faster than that of point A. The erosion of the target is proportional to the exposed time of the target for the plasma, and, in other words, is proportional to the quantity of the total length of an arc length divided by sweep velocity. The sweep velocity is in this case proportional to the radius of rotation and the total arc length corresponding to each point A, B, and C is shown as dashed curve length X, Y, and Z+Z' respectively in FIG. 4 (a).

The cross sectional view of the resultant erosion pattern is shown in FIG. 5. In FIG. 5, the points A, B, and C correspond to the regions of the same reference characters in FIG. 4(a). As can be seen in the figure, the depth of the groove at region A is deeper than that of the depth at region B and C. The pattern is far from uniform erosion, which is desirable to be as wide as possible.

SUMMARY OF THE INVENTION

It is a general object of the invention, therefore to provide a magnetic source, wherein a magnetic field thereof causes an uniform erosion of a target on its surface as wide as possible.

It is further object of the invention to increase an uniformity of deposition on a substrate as much as possible.

It is still further object of the invention to extend an usable time of the target as long as possible and reduce a fabrication cost.

An advantage of the present invention is that the above mentioned objects are achieved by a simple change in an arrangement of permanent magnets in a magnetic source, which is being rotated eccentrically around the center axis of the target, and any other change in a structure is not needed.

As explained in the prior art using FIG. 4(a), an uneven erosion is caused by a difference in the exposed time of the target for the plasma, therefore the present invention is to find a magnet arrangement, whereby the time of exposition is constant everywhere over the target surface.

When the magnetic source is rotated, the sweep velocity of the plasma region against the target is proportional to a radius of rotation, therefore if the total length of the plasma region of each magnet measured along the arc of the rotation is also designed to be proportional to the radius of rotation, the time of exposition is constant over the entire target surface.

As described above, the present invention is to provide the best arrangement of the permanent magnets, which gives the above arc length being almost proportional to the radius of rotation, and by this arrangement the uniform erosion is achieved.

In an actual design of the magnet arrangement, the plasma region is needed to make a closed-loop over the target, having a specific width which is defined by the region having parallel magnetic field component to the target as described in the prior art.

Detailed magnet arrangement will become more apparent from the following description and reference being had to the accompanied drawings.

Other aspects, objects, and the several advantages of the invention will also become apparent to the man skilled in the art from a reading of the following disclosure and appended claims.

BRIEF DESCRIPTION OF THE DRAWINGS

FIG. 3 is a cross sectional view of a planar magnetron sputtering apparatus, wherein the magnetic source is eccentrically rotated.

FIGS. 4(a) and 4(b) are a plan view and a cross sectional view of the magnetic source of the coaxial magnet arrangement to explain the problems in use.

FIGS. 10(a) and 10(b) show a top view and a side view of each permanent magnet of another type which is a constituent of the magnetic source of the present invention.

DETAILED DESCRIPTION OF THE PREFERRED EMBODIMENTS

Figure 1:
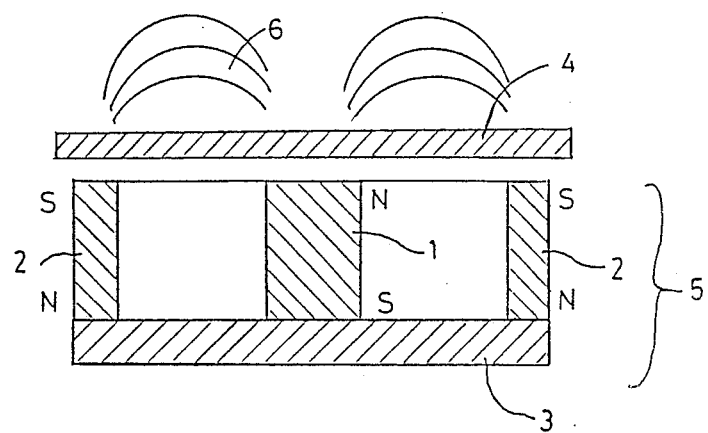
FIG. 1 is a cross sectional view of a magnetic source of the prior art, wherein coaxial magnets are used.
Figure 2:
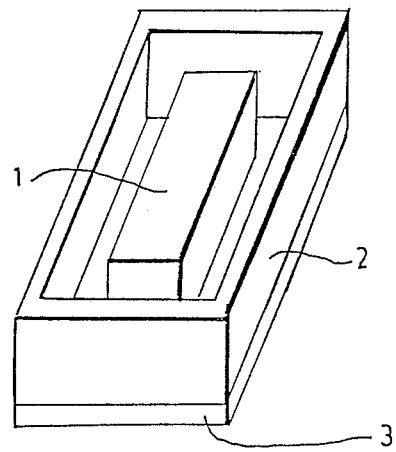
FIG. 2 is a perspective view of a rectangular-shaped magnetic source of the prior art, wherein a box-shaped outer magnet and a bar-type inner magnet are used.
Figure 5:
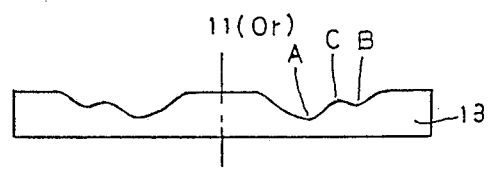
FIG. 5 shows a cross section of the target after being used combined with the magnetic source of the type shown in FIG. 4, showing uneven erosion of the target.

FIG. 6(a) shows a top view of a magnetic source 10 in FIG. 3 in accordance to the present invention, and the relative position and dimension of a circular target are shown by a circle 13. Other construction of the apparatus is just the same as shown in FIG. 3.

The magnetic source 10 comprises a plurality of permanent magnet assemblies 50, hereafter called as magnets or permanent magnets briefly. In FIG. 6(a), 18 pieces of magnets are used. In FIGS. 7(a) and 7(b), a top view and a side view of each magnet 50 are shown. The magnet 50 is fastened to the basis 56 (shown by the dashed line in FIG. 7) using a screw, and consists of two rectangular bar magnets 51, 52 axially polarized and a connecting yoke 53 thereof. The end sections of magnets 51, 52 have the same area, and magnets are so arranged that each cross section crosses with each other, in other words, forms a T-shape pattern. This construction makes it easy to arrange many magnets in a small area. The magnetic field 54 therefrom is shown by curves with an arrow. Therefore the plasma region is defined by two curves 58 and 59 (partially shown) in FIG. 6(a), where the magnetic fields have mainly parallel components with the target, and is shown as the crossed hatched area 55 between two curves.

FIG. 6(b) is a cross sectional view along a line B-B in FIG. 6(a). All magnets are fastened to a basis 56 using screws 57 or the adhesives. When the holes 57' are bored in the basis 56 in such a way that fixing positions of screws may be movable and adjustable, then the precise adjustment is possible to get more uniform erosion after a test run of the sputtering apparatus.

In determining the magnet arrangement of FIG. 6(a), a graphic method may be easy and useful. The method is explained using FIG. 8. Assuming the circle 13 shows a target size, and a doughnut region 63 between two circles 61 and 62 is an erosion area to be uniformly dislodged, the circles are equally divided by N/2 straight lines 641 through 648 passing the center Or and N pieces (in this Case N=16) of fan shaped sectors 651 through 666, having an interior angle $\alpha = 2\pi/N$, are formed, and then concentric circles 671 through 677, having equal differences in radius between two adjacent circles are drawn and thus N/2 (=8) circular trucks are formed.

16 points a, b, through p are cross points of the above straight lines and circles, and the curve is drawn by the following method. Starting from point a, which is located on the outermost circle 61 of the erosion area 63, a circular curve a-b-c is drawn, whereby connecting points b and c being located on the inner adjacent circle in alphabetical order. Thereafter curve b-c-d is drawn in the same way overlapping in the b-c region. Thus the curve, connecting points a, b through i in alphabetical order, is formed, whereby these crossing points being located on the inner adjacent circle in order. As a result, the point i is located on the circle 62, which defines the inside limit of erosion area. Thereafter a curve is drawn connecting i, j, k, through p and then returning to the starting point a in a reverse way, whereby crossing points being located on the outer adjacent circle in order. Thus a heart-shaped curve 67 is obtained.

Figure 8:
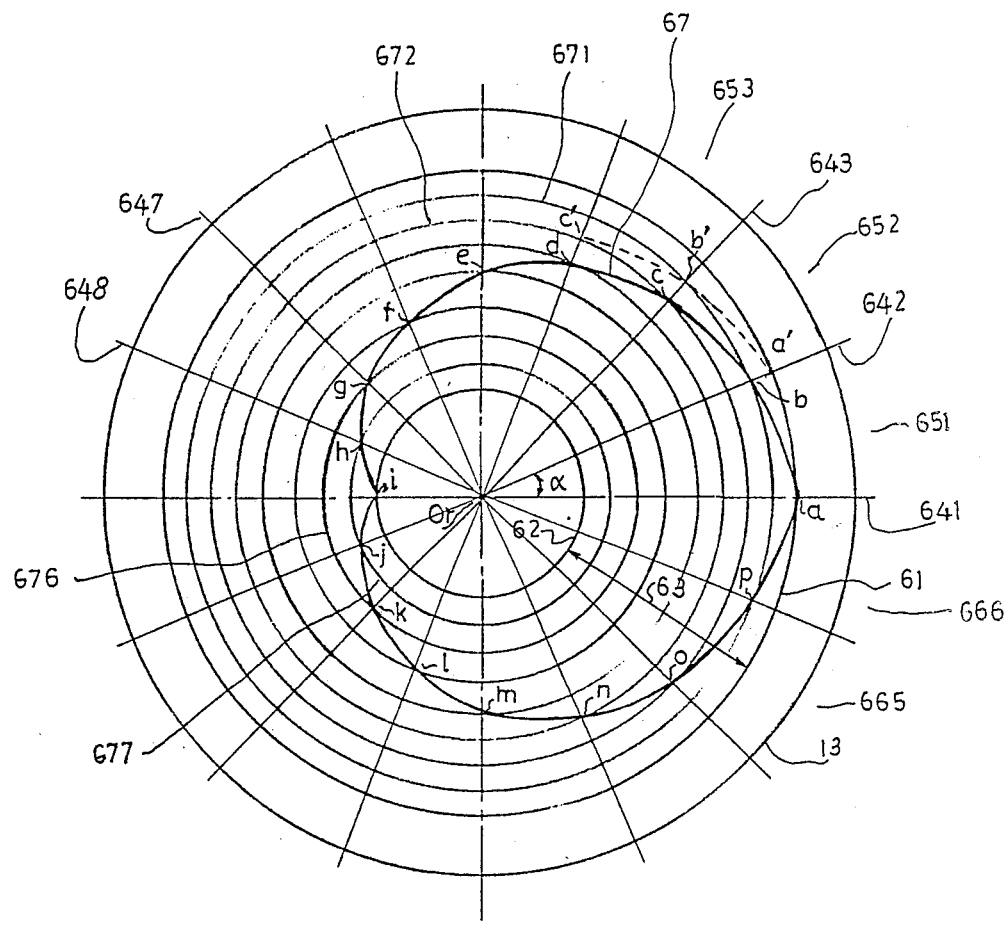
FIG. 8 explains a graphic method of determining the arrangement of each permanent magnet.

Assuming the curve 67 drawn in FIG. 8 corresponds to the plasma region 55 in FIG. 6(a) having a very narrow width, and the curve is rotated with an angular velocity $\omega$ around Or, then after a rotation of $\Delta\omega$, which is equal to $\alpha$ in this case, arc a-b moves to a'-b' and arc b-c to b'-c' respectively. Each swept area by the arcs a-b and b-c is almost proportional to radius Or-a and Or-b respectively. On the other side, a velocity which each arc sweeps the surface of the target is also proportional to the radius of rotation Or-a and Or-b respectively. As a result, any small area in the region swept by arc a-b and b-c is exposed to a plasma for the same period of time, and the erosion rate is almost the same.

In the entire erosion area 63 of FIG. 8, the above mentioned conditions are satisfied, and uniform erosion can be obtained.

In actual design of a magnet arrangement, when it is found to be difficult to arrange permanent magnets in such a way that a center line between poles of each magnet coincides the designed curve 67 of FIG. 8, some modifications become necessary. FIG. 6(a) shows the result of the actual arrangement, where 18 permanent magnets are used.

FIGS. 6(a) and FIG. 8 show the symmetrical patterns with respect to the horizontal lines of the figures. Therefore only a semicircular region is a subject of investigation.

Theoretically speaking, the similar method may be applied for the case of a quadrant, sextant, etc. when the curve 67 is continuous and returns to the original point after making one round. However the arrangement of magnets becomes rapidly difficult with a increased number of symmetry, if the target size is not sufficiently large.

Figure 9:
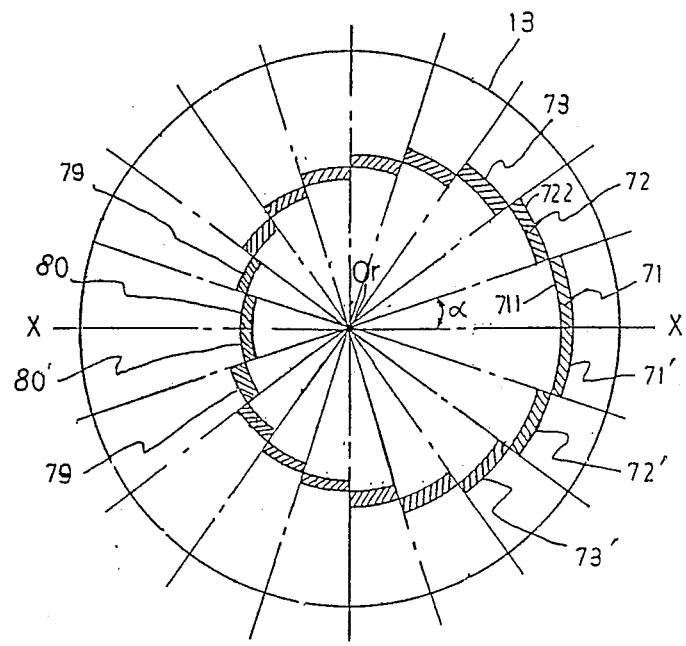
FIG. 9 shows a graphic method to supplement the understanding of the present invention.

From the theoretical standpoint, the magnetic field arrangement which is symmetrical with respect to a line X-X shown in FIG. 9, is easier to understand. In FIG. 9, each hatched area 71 through 80 and 71' through 80' indicates the area, having a parallel component of magnetic field with target surface (target is shown by a circle 13). Each arced area has the same interior angle $\alpha$, and constitutes a section of concentric annular rings, and the inside arc 711 of the area 71 is continuous with the outside arc 722 of the neighboring area 72. When the magnetic pattern is rotated around Or and sweeps the target surface, any small area thereon is exposed to the plasma for the same period of time. This arrangement is an idealized case of FIG. 6, and the following condition is always satisfied;

$$\Sigma L(r)/r = \Sigma \alpha = \text{const.}$$

In the equation, $\Sigma L(r)$ means the summation of each arc length having the same radius r, and $\alpha$ is the interior angle in radian for each arc.

However the plasma regions explained using FIG. 9 have discontinuities between two adjacent plasma regions and therefore in an actual case, the arrangement of magnets is modified to form the continuous loop of magnetic field tunnel. Then the similar pattern shown in FIG. 6 is actually used.

Figure 10B:
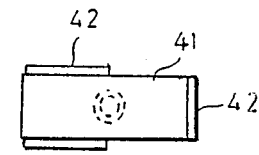
Figure 10B:
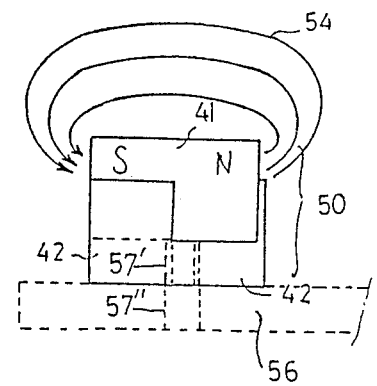

Figure 10 is another type of the permanent magnet 50, in which FIGS. 10(a) and 10(b) show a top view and a side view respectively. Comparing with the type shown in FIG. 7, the magnet 41 is a rectangular bar type and has a polarization axis parallel with the basis 56. The magnet 41 is fixed using the adhesive to non-magnetic supporting part 42, which has three protruding sides to make it easy to hold the magnet. This type has a slender width, therefore this has a feature of producing a broad magnetic field 54 compared with that shown in FIG. 7, which gives comparatively sharp magnetic field. A word 'sharp' or 'broad' used herein means that a change in magnetic field on the target surface is steep or not so steep. This type is favorable to obtain a broad erosion area compared with that of FIG. 7.

The magnetic source comprising a plurality of permanent magnets and a basis supporting these magnets. wherein the basis being rotated around the axis located at the center of the target and perpendicular thereto, has been explained laying stress on a magnet arrangement which produces an uniform erosion of the target. The pattern of the magnet arrangement is mainly explained emphasizing on the heart-shaped type.

Figure 6:
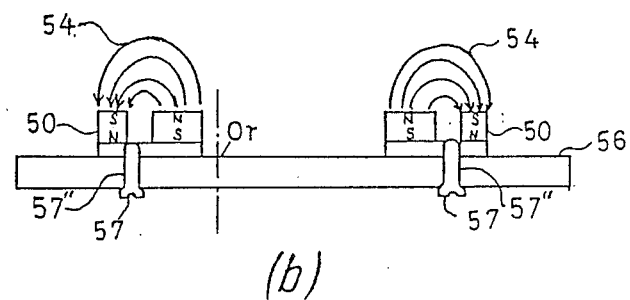
FIG. 6(a) shows a schematic top view of the magnetic source of the present invention, wherein a plurality of permanent magnet assemblies are arranged in a heart-shaped pattern and eccentric with respect to the target surface.
FIG. 6(b) shows a cross sectional view of a structure of FIG. 6(a) along a line B-B.
Figure 6:
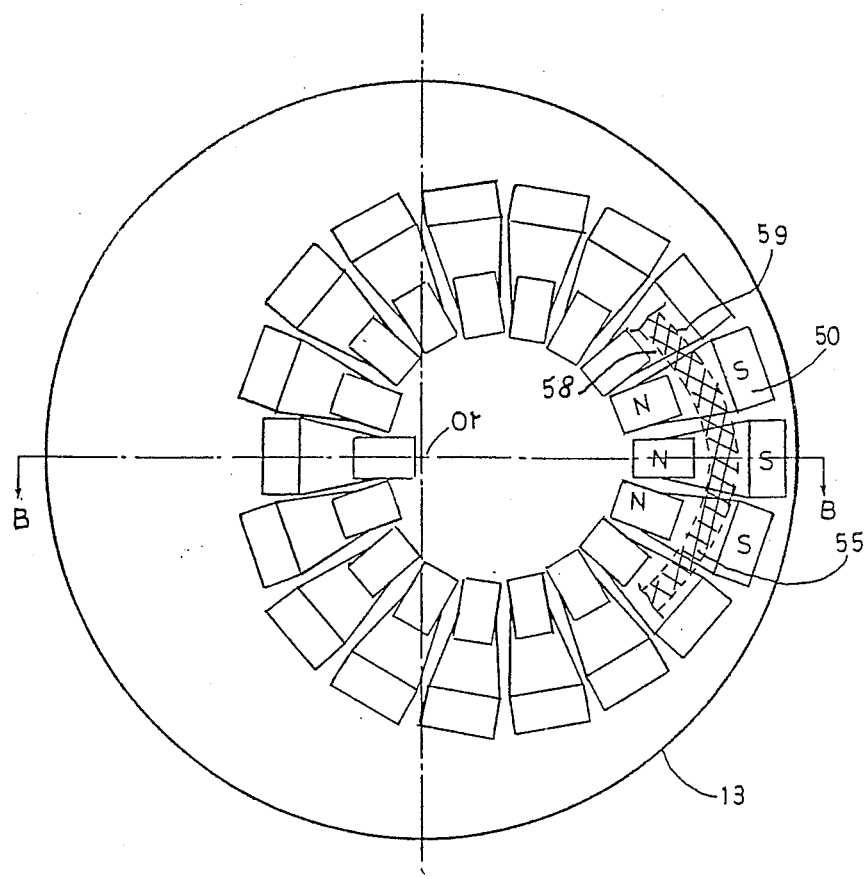
Figure 7A:
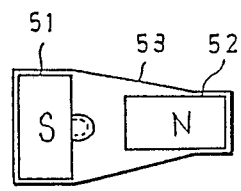
FIGS. 7(a) and 7(b) show a top view and a side view of each permanent magnet, which is a constituent of the magnetic source of the present invention.
Figure 7B:
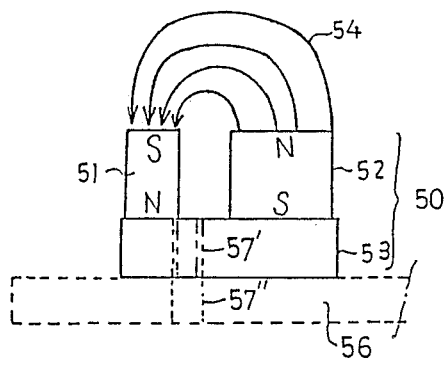

When the structure such as shown in FIG. 6 is used as the magnetic source 10 in the sputtering apparatus of FIG. 3 and the aluminum target of 12 inch diameter, for example, is used, the life of the target is extended by more than twice compared with the result of the prior art. The magnetic source also may be used by the air-cooling or water-cooling using the jacket 26 as shown in FIG. 3.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the forgoing description, and all changes which come within the meaning and range of equivalence of the claims are, therefore, to be embraced therein.

We claim:

1. A planar magnetron sputtering apparatus utilizing a plasma formed by an electromagnetic field, said apparatus comprising:
   an evacuable chamber having a means for introducing an inert gas and a means for holding a substrate for deposit;
   a planar target within said chamber, a front face of said target faces in parallel with said substrate;
   means for applying an electric field over the front surface of said target;
   a mounting base; and
   magnetic source means for generating a magnetic field over the surface of said target, said magnetic source means being positioned behind said target and being rotated around a center axis of said target, a plane of rotation being maintained in parallel with said target, said magnetic source means being composed of a plurality of permanent magnets arranged on said mounting base, each permanent magnet being arranged in a way that similar poles are toward said center axis, each permanent magnet being aligned in a direction of said rotation to form a closed contour having a distance from the center axis which gradually decreases and then increases, said closed contour forming a heart-shaped-like contour on said mounting base, each permanent magnet having a lateral width measured in a direction of said rotation, each lateral width, along the entire closed contour, being substantially proportional to a radius of rotation about said center axis, so that a plasma region is formed over the surface of said target, an instantaneous length of said plasma region, measured along an arc of said rotation, being proportional to a radius of rotation, wherein substantially all of the said surface of said target is exposed during the rotation of the magnetic source means to the plasma generated by said magnetic field for substantially the same period of time.

2. A planar magnetron sputtering apparatus according to claim 1, wherein said permanent magnets are arranged in the symmetrical pattern.

3. A planar magnetron sputtering apparatus according to claim 2, wherein said arrangement of the permanent magnets is symmetrical with respect to the line passing through the center of rotation, and the outermost and innermost points of said closed contour are positioned on said line.

4. A planar magnetron sputtering apparatus according to claim 3, wherein said magnetic field which forms said closed contour is a heart-shaped pattern.

5. A planar magnetron sputtering apparatus according to claim 1, wherein each said permanent magnet comprises two pieces of rectangular bar magnets, each bar magnet is magnetized in the direction of axis, and each two pieces of said bar magnets have the same cross section, and each two pieces of said bar magnets are so arranged on a yoke that the direction of each cross section crosses with each other.

6. A planar magnetron sputtering apparatus according to claim 1, wherein each said permanent magnet consists of a single magnet having axial polarization parallel with the basis, and a supporting part thereof.

7. A planar magnetron sputtering apparatus according to claim 1, wherein said magnetic source is encased in a cooling jacket, which is fixed to a backing plate holding said target on an opposite side, and is water-cooled.

8. A planar magnetron sputtering apparatus according to claim 1, wherein said closed contour is rotated eccentrically around the center axis.

9. A planar magnetron sputtering apparatus utilizing a plasma formed by an electromagnetic field, said apparatus comprising:
   an evacuable chamber having a means for introducing an inert gas and a means for holding a substrate for deposit;
   a planar target within said chamber, a front face of said target faces in parallel with said substrate;
   means for applying an electric field over the front surface of said target;
   a mounting base; and
   magnetic source means for generating a magnetic field over the surface of said target, said magnetic source means being positioned behind said target and being rotated around a center axis of said target, a plane of rotation being maintained in parallel with said target, said magnetic source means being composed of a plurality of permanent magnets arranged on said mounting base, each permanent magnet being arranged in a way that similar poles are toward said center axis, each permanent magnet being aligned in a direction of said rotation to form a closed contour having a distance from the center axis which gradually decreases and then increases, said closed contour forming a heart-shaped-like contour on said mounting base, each permanent magnet having a lateral width measured in a direction of said rotation, each lateral width, along the entire closed contour, being substantially proportional to a radius of rotation about said center axis and a change in lateral width, along the entire closed contour, from an adjacent lateral width being substantially equal, so that a plasma region is formed over the surface of said target, an instantaneous length of said plasma region, measured along an arc of said rotation, being proportional to a radius of rotation, wherein substantially all of the said surface of said target is exposed during the rotation of the magnetic source means to the plasma generated by said magnetic field for substantially the same period of time.

* * * * *